(12) United States Patent
Cachier et al.

(10) Patent No.: US 6,239,400 B1
(45) Date of Patent: May 29, 2001

(54) METHOD AND DEVICE FOR CONNECTING TWO MILLIMETER ELEMENTS

(75) Inventors: Gérard Cachier, Bures sur Yvette; Jean-Yves Daden, Bois Colombes; Alain Grancher, Vemars, all of (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/424,224

(22) PCT Filed: May 15, 1998

(86) PCT No.: PCT/FR98/00981

§ 371 Date: Nov. 23, 1999

§ 102(e) Date: Nov. 23, 1999

(87) PCT Pub. No.: WO98/53518

PCT Pub. Date: Nov. 26, 1998

(30) Foreign Application Priority Data

May 23, 1997 (FR) .................................................. 97 06328

(51) Int. Cl.⁷ .................................................. B23K 19/04
(52) U.S. Cl. ..................... 219/85.22; 219/85.18; 228/260; 228/175; 228/179.1
(58) Field of Search ............................. 219/85.22, 85.18; 228/260, 175, 179.1; 361/600, 611, 767

(56) References Cited

U.S. PATENT DOCUMENTS

| | | | |
|---|---|---|---|
| 3,997,100 | * 12/1976 | Hofmeister | 228/179 |
| 4,028,556 | 6/1977 | Cachier et al. . | |
| 4,054,875 | 10/1977 | Cachier . | |
| 4,126,932 | 11/1978 | Cachier . | |
| 4,152,718 | 5/1979 | Cachier . | |
| 4,197,546 | 4/1980 | Cachier et al. . | |
| 4,278,951 | 7/1981 | Cachier et al. . | |
| 4,280,110 | 7/1981 | Cachier et al. . | |
| 4,306,312 | 12/1981 | Cachier . | |
| 4,333,076 | 6/1982 | Cachier . | |
| 4,627,565 | * 12/1986 | Lomerson | 228/107 |
| 4,816,789 | * 3/1989 | Mars | 333/246 |
| 4,876,239 | 10/1989 | Cachier . | |
| 5,175,597 | 12/1992 | Cachier et al. . | |
| 5,262,796 | 11/1993 | Cachier . | |
| 5,313,693 | 5/1994 | Cachier . | |
| 5,469,130 | * 11/1995 | Okada et al. | 333/246 |
| 5,543,765 | 8/1996 | Cachier . | |
| 5,847,356 | * 12/1998 | Santhanam | 219/121.64 |
| 5,977,618 | * 11/1999 | DiStefano et al. | 257/674 |
| 5,983,492 | * 11/1999 | Fjelstad | 29/843 |
| 6,169,663 | * 1/2001 | Garcia | 361/760 |

FOREIGN PATENT DOCUMENTS

| 0747997 A2 | * 11/1996 | (EP) . |
|---|---|---|
| 2193848 | * 2/1988 | (GB) . |
| 63-13401 | * 1/1988 | (JP) . |

* cited by examiner

*Primary Examiner*—Patrick Ryan
*Assistant Examiner*—Colleen Cooke
(74) *Attorney, Agent, or Firm*—Oblon, Spivak, McClelland, Maier & Neustadt, P.C.

(57) ABSTRACT

A process and a device for bonding two millimeter elements. The process makes, at determined locations of each of the two millimeter elements, bonding zones set to the potential of a second plane. Then, the process makes the bond by determined connections between the bonding zones and between conducting lines of the two millimeter elements. The device includes a coplanar line. Such a process and device may find particular application to millimeter circuits implementing conducting lines of the microstrip type.

18 Claims, 5 Drawing Sheets

VIEW AA'

VIEW B

VIEW CC'

METHOD AND DEVICE FOR CONNECTING TWO MILLIMETER ELEMENTS

BACKGROUND OF THE INVENTION

1. Field of the Invention

The present invention relates to a process and a device for bonding two millimeter elements. Millimeter elements are implemented with signals whose frequency is typically greater than 30 GHz.

It makes it possible in particular to bond two millimeter elements consisting of a millimeter circuit made on a printed circuit implementing conducting lines of the microstrip type.

2. Discussion of the Background

Printed circuits on which millimeter circuits are made contain propagation lines which are mainly of two types.

The first type is said to be coplanar. In this case, the printed circuit implements coplanar lines. A coplanar line consists of a conducting line surrounded by two earth planes situated symmetrically on either side of the conducting line; the conducting line and the earth planes being situated on the same face of the substrate of the printed circuit. The bonds between millimeter circuits are made by wires. These bonds can introduce disturbances when the circuits to be bonded are too far apart. This is because an electric field spreads horizontally between the central conductor, connected to the conducting line, and the lateral conductors, situated on either side, connected to the earth planes. The characteristic impedance of this propagation line is determined mainly by the ratio between the width of the conductor and the width of the space between the central conductor and the lateral conductors, as well as by the dielectric constant of the support, namely air.

The second type is the so-called microstrip. In this case, the printed circuit implements microstrip lines. The printed circuit thus comprises a dielectric substrate with two main faces, an upper and a lower. A conductor having the form of a strip is made on the upper face and an earth conductor is made on the whole of the lower face. In accordance with this arrangement an electric field spreads between the strip-like conductor and the earth conductor. When making a microwave-frequency device, various millimeter elements are arranged in a specific metal casing. The millimeter elements may consist of millimeter circuits made on a printed circuit, of substrates or of components. Each millimeter element is attached to a bedplate screwed onto the metal casing. Under these conditions, earth continuity is achieved on the one hand by soldering or by conductive cementing to the entire surface of the printed circuit and on the other hand by screwing the bedplate to the metal package. In the millimeter frequency region, the earth continuity of the microwave-frequency device described above may not be of sufficient quality. In particular, when earth continuity is ensured by contact, between a package screwed onto the casing and the casing for example, the latter may not be of good quality, if the screwing is insufficient or if the surfaces in contact are not perfectly plane, for example. Moreover, when two millimeter circuits to be bonded are far apart, the techniques described above may not be useable.

SUMMARY OF THE INVENTION

The aim of the invention is to alleviate the aforesaid drawbacks.

The subject of the invention is a process for bonding a first and a second millimeter element made on a dielectric substrate, exhibiting an upper face and a lower face, which substrate is delimited at one end by an edge of determined length and equipped with a printed circuit implementing conducting lines interacting with an earth plane, characterized in that it comprises the following steps:

selecting a first conducting line belonging to the first millimeter element and a second conducting line belonging to the second millimeter element, making on the upper face of the dielectric substrate of the first millimeter element, on either side of one end of the first conducting line, according to a determined distribution, at least two bonding zones set to the potential of the earth plane and making in a similar manner according to the same distribution the same number of bonding zones on the upper face of the dielectric substrate of the second millimeter element on either side of one end of the second conducting line, bonding the first conducting line to the second conducting line and each of the bonding zones, taken individually, of the first millimeter circuit to a bonding zone and one only of the second millimeter circuit by means of determined connections.

The subject of the invention is also a device for ensuring the bonding of two millimeter elements.

BRIEF DESCRIPTION OF THE DRAWINGS

The invention will be better understood and its advantages and drawbacks will become more clearly apparent during the following description given by way of non-limiting illustration and given with regard to the following figures.

DESCRIPTION OF THE PREFERRED EMBODIMENTS

In the various figures, the counterpart elements are represented with the same numerical reference.

Figure 1:
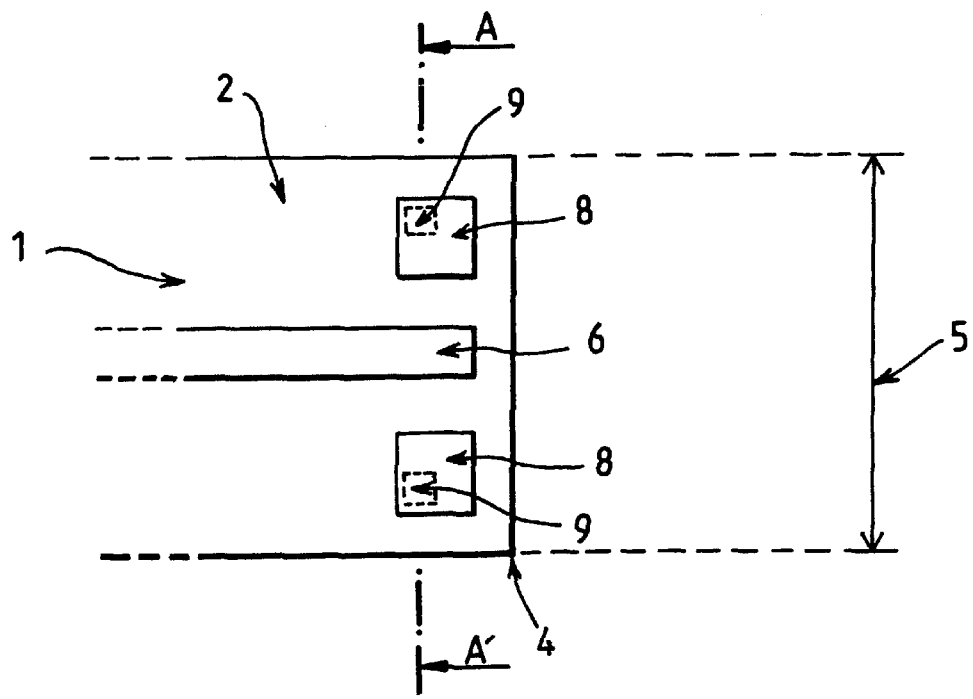
FIG. 1, an end of a first millimeter circuit.
Figure 2:
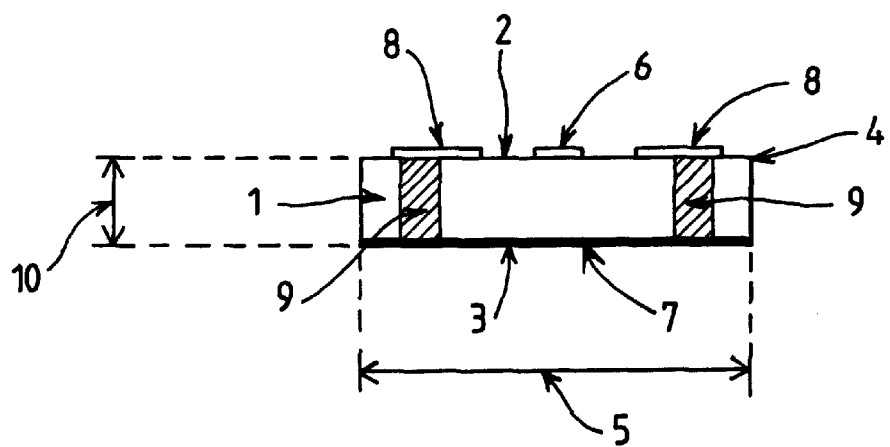
FIG. 2, a sectional view of the millimeter circuit of FIG. 1.

FIGS. 1 and 2 represent an end of a printed circuit of a millimeter circuit. FIG. 2 is a sectional view through the axis AA' of the printed circuit represented in FIG. 1. The printed circuit is made on a dielectric substrate 1 having an upper face 2 and a lower face 3. The represented end of the dielectric substrate 1 terminates in an edge 4 of determined length 5, of the order of 5 mm for example. Between at least a first and a second particular point, the millimeter circuit carries out a particular function, filtering for example. To carry out this particular function, the millimeter circuit can comprise, for example, components, not represented, such as capacitors, resistors, amplifiers, soldered to the printed circuit. The millimeter circuit is used in the microwave frequency region; within the framework of the invention, the frequencies implemented are preferably greater than 30 GHz. Having regard to the particular problems linked with microwave frequencies, the printed circuits of the millimeter circuits implement propagation lines. A propagation line is made by a conducting line which interacts with an earth plane. The printed circuit represented in FIGS. 1 and 2 implements conducting lines of the microstrip type. According to this type, a conducting line is a conductor 6, having the form of a strip, situated on the upper face 2 of the dielectric substrate 1. The conductor 6 interacts with an earth plane 7 which covers the entire lower face 3 of the dielectric substrate 1, producing an electric field between the conductor 6 and the earth plane 7. In accordance with the process according to the invention for bonding the first millimeter circuit, represented in FIGS. 1 and 2, to a second millimeter circuit, not represented, a first conducting line is selected on the first millimeter circuit, the conductor 6, during a first step.

Figure 3:
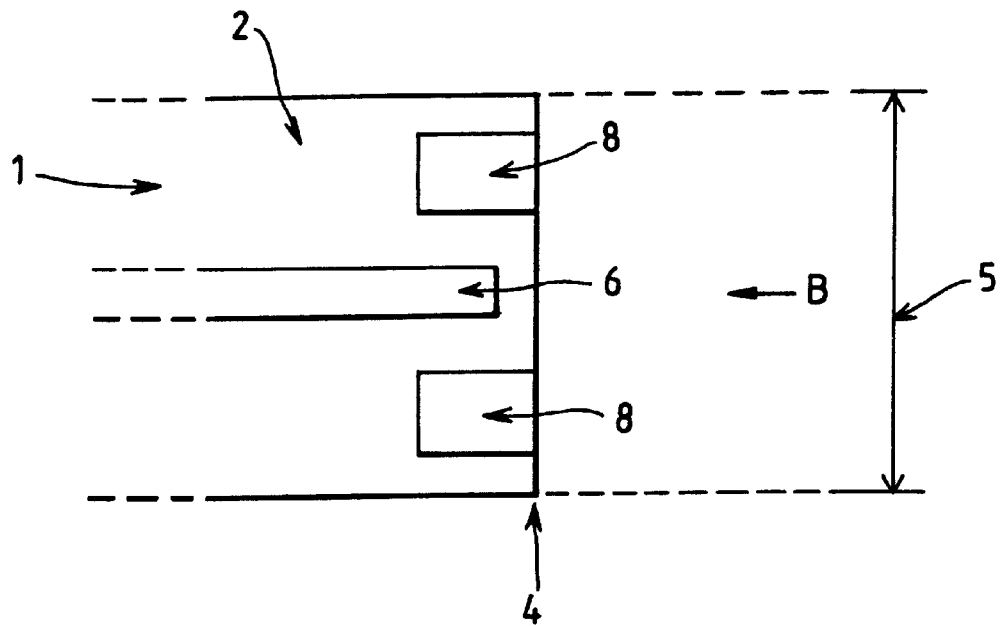
FIG. 3, an end of a second millimeter circuit.
Figure 4:
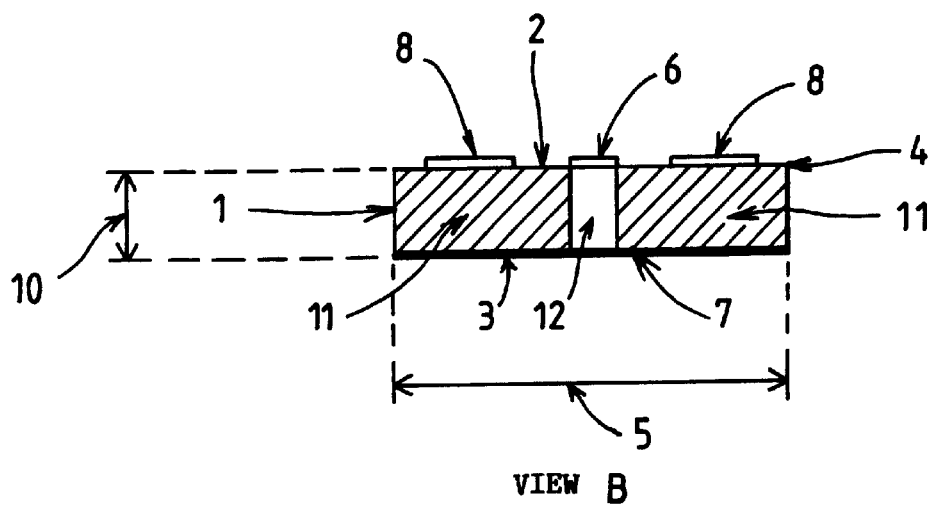
FIG. 4, a sectional view of the millimeter circuit of FIG. 3.
Figure 5:
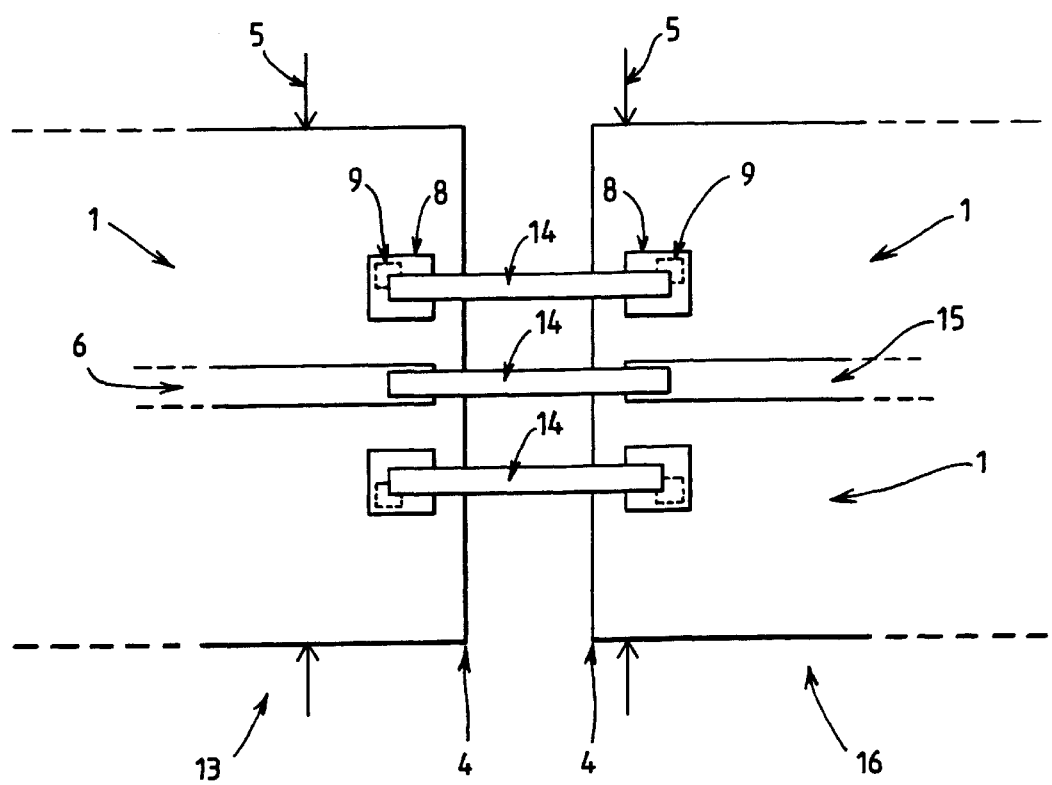
FIG. 5, two millimeter circuits bonded in accordance with a process according to the invention, FIG. 6, a device which bonds, according to a process according to the invention, a first millimeter circuit to a second millimeter circuit, FIG. 7, a sectional view of the assembly represented in FIG. 6, FIG. 8, a millimeter element mounted in accordance with a surface-mounted components technique and bonded to a substrate according to a process according to the invention.

The subsequent step consists in making at least two bonding zones 8 on the upper face 2 of the dielectric substrate 1 on either side of an end of the first conducting line selected, the conductor 6. These bonding zones 8 have the particular feature of being set to the potential of the earth plane 7. According to the example chosen and illustrated by FIGS. 1 and 2, the bonding zones 8 are set to the potential of the earth plane 7 by a metallized feed-through 9 passing through the thickness 10 of the dielectric substrate 1. According to a variant of the process, the bonding zones 8 are set to the potential of the earth plane 7 by a metallization on a rim of the dielectric substrate 1. This variant is illustrated in FIGS. 3 and 4. FIG. 4 is a side view of FIG. 3, along the arrow B. The rim adopted is preferably the one situated beneath the edge 4. So as not to create any additional tip capacitance, the metallized parts 11 of the rim cover the whole of the rim with the exception of that zone 12 of the rim which is situated plumb with the conductor 6. The bonding zones 8 are positioned along the edge 4 of the dielectric substrate 1 so that there is electrical continuity between the bonding zones 8 and the metallized parts 11 of the rim. The last step of the process is described with regard to FIG. 5.

The first conducting line 6, selected beforehand, belonging to a first millimeter circuit 13 is bonded according to a first embodiment, by means of gold wires 14, to a second conducting line 15 belonging to a second millimeter circuit 16. Each of the bonding zones 8, taken individually, of the first millimeter circuit 13 is bonded, by means of a gold wire 14, to one and one only bonding zone 8 of the second millimeter circuit 16. In the example represented in FIG. 5, each millimeter circuit 13, 16 is equipped with two bonding zones 8, distributed along the edge 4 of the dielectric substrate 1. Bonding by gold wires, illustrated in FIG. 5, may not be possible when, for example, the two millimeter circuits to be bonded are too far apart. According to a second embodiment, the bonds between the first and the second millimeter circuits are made by soldered wires. According to a third embodiment, the bonds between the first and the second millimeter circuits are made by a particular device known as a "lead frame". This device consists of wires photoetched onto a small plate. During the process the wires are soldered by electric soldering to the first millimeter circuit then they are soldered to the second millimeter circuit according to a particular technique of the wave soldering type or of the vapour phase soldering type for example.

A variant of the process makes it possible to remedy the bonding difficulty which the previous three embodiments cannot solve. The variant is illustrated by FIGS. 6 and 7.

Figure 6:
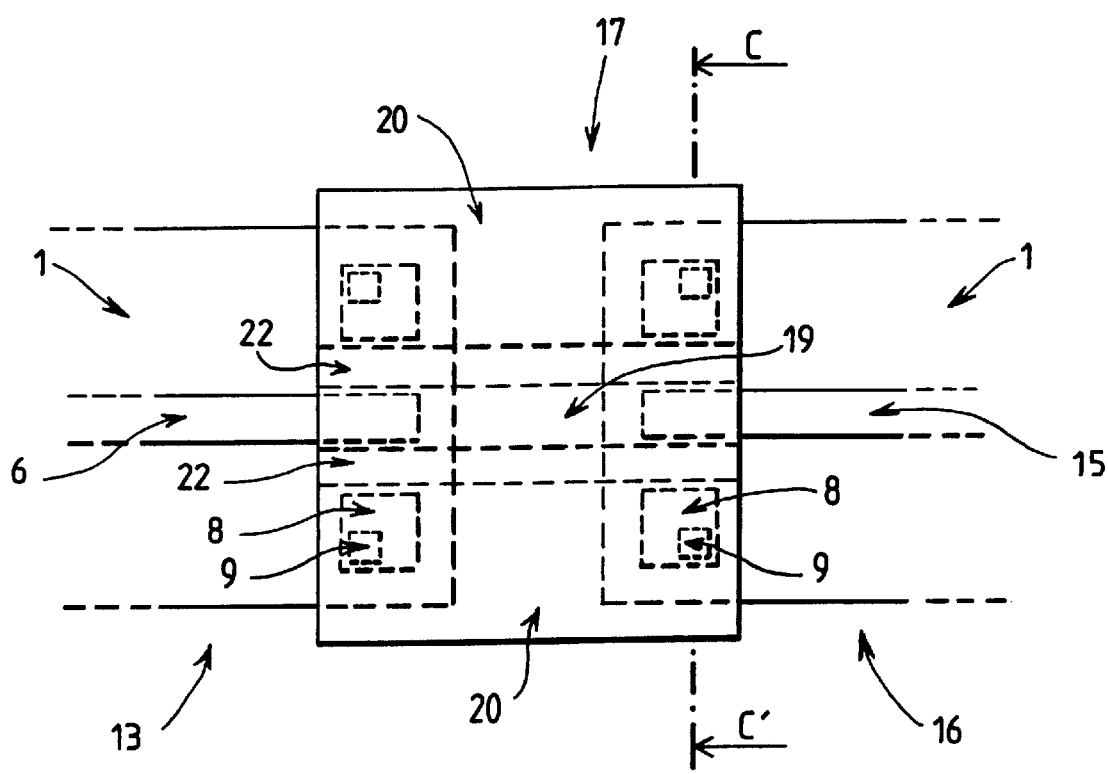
Figure 7:
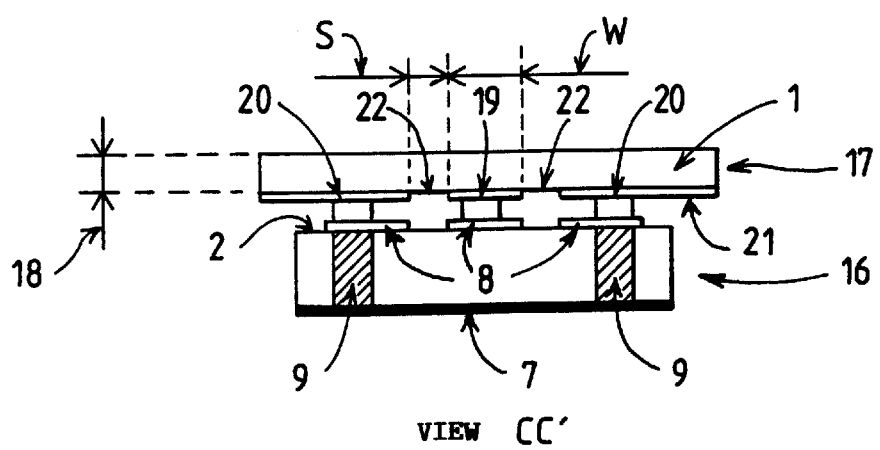

FIG. 7 is a sectional view through the axis CC' of the millimeter circuit represented in FIG. 6. According to this variant, the bond between two millimeter circuits 13 and 16 is made by a coplanar line 17. The coplanar line 17 is made on a substrate 1, of determined thickness 18 and having a high dielectric constant, such as an alumina. The coplanar line 17 is formed by a conducting line 19 of determined width W bordered by two earth planes 20 situated symmetrically on either side of the conducting line 19 on the same upper face 21 of the substrate. The conducting line 19 and the two earth planes 20 can be obtained by depositing thin photoetched layers. The conducting line 19 is separated from each of the two earth planes 20 by a non-metallized space 22 of determined width S. Preferably, the values of the width W of the conducting line 19, of the width S of the space 22 separating the conducting line 19 from the two earth planes 20 and of the dielectric constant of the substrate 1 are determined in such a way that the coplanar line 17 possesses a characteristic impedance identical to the characteristic impedance of the conducting lines 6 and 15 belonging to the millimeter circuits 13 and 16 to be bonded, for example 50 ohms. The coplanar line 17 is arranged on the two millimeter circuits 13 and 16 to be bonded with the upper face 21 opposite the upper faces 2 of the two millimeter circuits 13 and 16. It is thereafter soldered by a technique such as those used for soldering SMCs, the abbreviation for Surface Mounted Components, for example a wave soldering technique. On completing the soldering operation, electrical continuity of very good quality is ensured between the conducting lines 6 and 15 of the two millimeter circuits 13 and 16 and between the bonding zones 8 of the two millimeter circuits 13 and 16.

Figure 8:
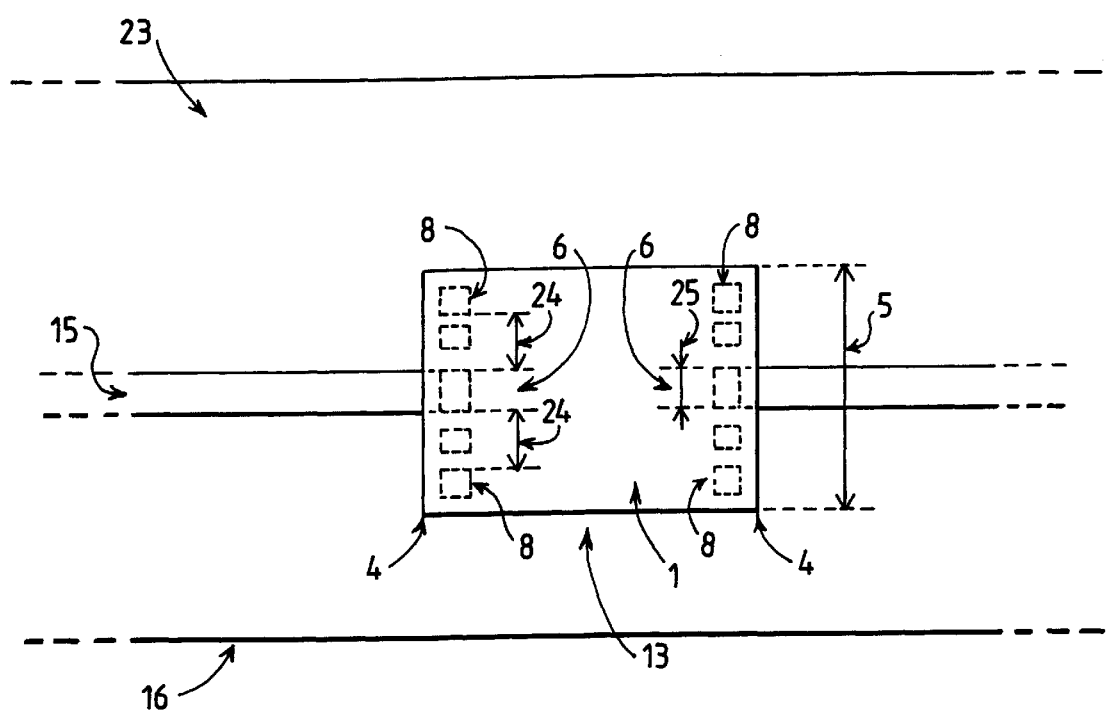

In certain configurations, especially those relating to surface mounting techniques, the earth planes of the millimeter elements to be bonded together may not be situated in the same geometrical plane. Under these conditions, the bonding of the millimeter elements is carried out in accordance with a particular embodiment of the process. In the case of a millimeter element transferred to a substrate, after selecting the conducting lines and making the bonding zones, the bonds between conducting lines and bonding zones are made directly by soldering, of the wave soldering type for example. In a preparation step of the process, a hole is made in the substrate so as to avoid any mechanical or electrical problem when transferring the millimeter element to the substrate. In these configurations and under certain conditions, defects in earth continuity may appear. They disturb the local electric field and worsen the performance of the millimeter element. A variant of the process makes it possible to remedy this problem. In accordance with the illustration given in FIG. 8, bonding zones 8 are distributed along the entire edge 4 of the dielectric substrate 1 of the millimeter element 13 attached, as well as opposite the transfer substrate 23. In particular two additional bonding zones 8 are made at a large distance 24 from the conducting line 6. This distance 24 is such that the additional bonding zones 8 are situated in the corners of the dielectric substrate 1 of the millimeter element 13 attached when the width 5 of the dielectric substrate 1 lies between around three times the width 25 of the conducting line 6 and one hundred times this same width 25.

The bonding process has been described essentially with regard to millimeter circuits implementing conducting lines of the microstrip type. It applies also to millimeter circuits implementing conducting lines of the coplanar type made on dielectric substrates. Under these conditions, the bonding zones are made directly on the earth planes arranged on one and the same face of the dielectric substrate. The potential of the bonding zones is thus by nature that of the potential of earth.

What is claimed is:

1. Process for bonding a first and a second millimeter element made on a dielectric substrate, exhibiting an upper face and a lower face, which substrate is delimited at one end by an edge of determined length and equipped with a printed circuit implementing conducting lines interacting with an earth plane, characterized in that it comprises the following steps:

selecting a first conducting line belonging to the first millimeter element and a second conducting line belonging to the second millimeter element, making on the upper face of the dielectric substrate of the first millimeter element, on either side of one end of the first conducting line and perpendicularly to the latter, at least two bonding zones set to the potential of the earth plane and distributed along the edge of the dielectric substrate and making in a similar manner according to the same distribution the same number of bonding zones on the upper face of the dielectric substrate of the second millimeter element on either side of one end of the second conducting line and perpendicularly to the latter, bonding the first conducting line to the second conducting line and each of the bonding zones, taken individually, of the first millimeter circuit to a bonding zone and one only of the second millimeter circuit by means of determined connections.

2. Process according to claim 1, characterized in that the conducting lines are of the microstrip type and in that the bonding zones made on either side of the conducting lines are set to the potential of the earth plane by metallized feed-throughs made in the dielectric substrate.

3. Process according to claim 1, characterized in that the conducting lines are of the microstrip type and in that the bonding zones made on either side of the conducting lines are set to the potential of the earth plane by a metallization deposited on a part of a rim of the dielectric substrate.

4. Process according to claim 1, characterized in that the determined connections are gold wires.

5. Process according to claim 1, characterized in that the determined connections are soldered wires.

6. Process according to claim 1, characterized in that the determined connections are made by a device consisting of wires photoetched onto a small plate and attached by electric soldering to the first millimeter element then soldered to the second millimeter element by a technique of wave soldering or of vapour phase soldering.

7. Process according to claim 1, characterized in that the determined connections consist of at least one coplanar line, consisting of a conducting line bordered by a first and a second earth plane, which line is made on a substrate with a high dielectric constant, and is dimensioned so as to possess a determined characteristic impedance.

8. Device for bonding in accordance with the process according to claim 1, a first and a second millimeter element, characterized in that it consists of a coplanar line consisting of a conducting line bordered by a first and a second earth plane, which line is made on a substrate with a high dielectric constant and is dimensioned so as to possess a determined characteristic impedance.

9. Device according to claim 8, characterized in that the dielectric substrate is an alumna and in that the coplanar line is made by depositing the various conductors of the coplanar line as photoetched thin layers.

10. Process according to claim 2, characterized in that the determined connections are gold wires.

11. Process according to claim 2, characterized in that the determined connections are soldered wires.

12. Process according to claim 2, characterized in that the determined connections are made by a device consisting of wires photoetched onto a small plate and attached by electric soldering to the first millimeter element then soldered to the second millimeter element by a technique of wave soldering or of vapour phase soldering.

13. Process according to claim 2, characterized in that the determined connections consist of at least one coplanar line, consisting of a conducting line bordered by a first and a second earth plane, which line is made on a substrate with a high dielectric constant, and is dimensioned so as to possess a determined characteristic impedance.

14. Process according to claim 3, characterized in that the determined connections are gold wires.

15. Process according to claim 3, characterized in that the determined connections are soldered wires.

16. Process according to claim 3, characterized in that the determined connections are made by a device consisting of wires photoetched onto a small plate and attached by electric soldering to the first millimeter element then soldered to the second millimeter element by a technique of wave soldering or of vapour phase soldering.

17. Process according to claim 3, characterized in that the determined connections consist of at least one coplanar line, consisting of a conducting line bordered by a first and a second earth plane, which line is made on a substrate with a high dielectric constant, and is dimensioned so as to possess a determined characteristic impedance.

18. Process according to claim 1, characterized in that there are two bonding zones, each one on one side of the one end of the first conducting line, respectively of the second conducting line, and each bonding zone having a determined length along the edge.

* * * * *